METHOD OF FORMING A FLIP-CHIP INTEGRATED CIRCUIT

Filed Aug. 3, 1967

INVENTOR.
ROGER W. MURRAY
BY Flehr, Hohbach, Test, Albritton & Herbert
ATTORNEYS United States Patent Office 3,442,012

Patented May 6, 1969

3,442,012

METHOD OF FORMING A FLIP-CHIP INTEGRATED CIRCUIT

Roger W. Murray, Palo Alto, Calif., assignor to Teledyne, Inc., Mountain View, Calif., a corporation of Delaware Filed Aug. 3, 1967, Ser. No. 658,153
Int. Cl. B01j *17/00;* H01l *7/00;* B44d *1/18*
U.S. Cl. 29—590 5 Claims

ABSTRACT OF THE DISCLOSURE

A raised contact pad on a flip-chip type integrated circuit is coupled to an active region by providing a platinum ohmic contact in a window exposing an active semiconductive region. An initial underlay of aluminum which is easily etched allows the unwanted portions of platinum to be stripped away. Thereafter a second underlay of aluminum is selectively placed on areas which are to be ultimately stripped, except for the electrical contact region area between the semiconductive region and the raised contact. Layers of tantalum and gold are placed over the entire chip. The aluminum underlayer is then etched away allowing the gold tantalum layers to be stripped off except in the electrical circuit area. A raised gold contact pad is placed on the top gold layer to form the final device.

The present invention is directed to a method of forming flip-chip integrated circuits and more specifically to providing a raised contact on a chip and coupling it to an active semiconductive region.

In the present day packaging technology for integrated circuits, such circuits are formed in chips of semiconductive material. Thin film leads having raised contacts or "bumps" make connections thereto. The circuits are then flipped upon a common interconnecting substrate. The raised contact pads of the individual chips are electrically connected to the desired active semiconductive regions of each chip and by reason of the pressure contact between the chip and the common substrate interconnection is accomplished. It is, of course, obvious that the individual raised contacts should be constructed of material having a very high conductivity such as gold, etc.

However, with the use of high conductivity "bumps" the problems of installation of these bumps on the individual chips becomes formidable due to processing incompatibilities of the high conductivity materials with the normal materials used in fabrication of a semiconductive chip-type integrated circuit; for example, such materials as gold, tantalum and platinum are relatively difficult to etch by presently known methods and thus the formation of the proper conductive thin film patterns on a semiconductive chip is difficult. A material, on the other hand, such as aluminum, which is relatively easy to utilize in the common etching processes for the manufacture of semiconductive chips, may not yield satisfactory levels of conductivity and competent contact for many applications.

It is therefore a general object of the present invention to provide an improved method of forming a flip-chip type integrated circuit embodying the present invention.

It is another object of this invention to provide an improved method as above where a gold contact pad is formed on a chip.

It is another object of the invention to provide an improved method as above which enables a conductive pattern to be formed from relatively non-etchable materials.

In accordance with the above objects there is provided a method of forming a flip-chip type integrated circuit which includes a raised contact pad constituted of a low resistance material affixed to a conductive base layer which is deposited on a surface of the chip. The base layer makes contact with an active semiconductive region of the integrated circuit to complete an electrical circuit from the active region to the pad. The eletrical circuit constitutes a predetermined area on the chip.

The improvement comprises the steps of opening a window on the oxide passivating layer of the chip to expose an active region of the integrated circuit to which electrical contact is to be made. A film of material is deposited on the chip which excludes the electrical circuit area, the film being relatively easy to etch. Thereafter the base layer is deposited on the chip whereby a portion of the base layer overlies the film. The film is removed by etching and thereafter the overlying base layer is stripped away leaving a base layer deposited only on the electrical circuit area. The raised contact pad is later affixed to the base layer.

These and other objects of the invention become more clearly apparent from the following description.

Referring to the drawings.

Figures 1, 2, 3, 4, 5, 6, 7, 8, 9, 10:
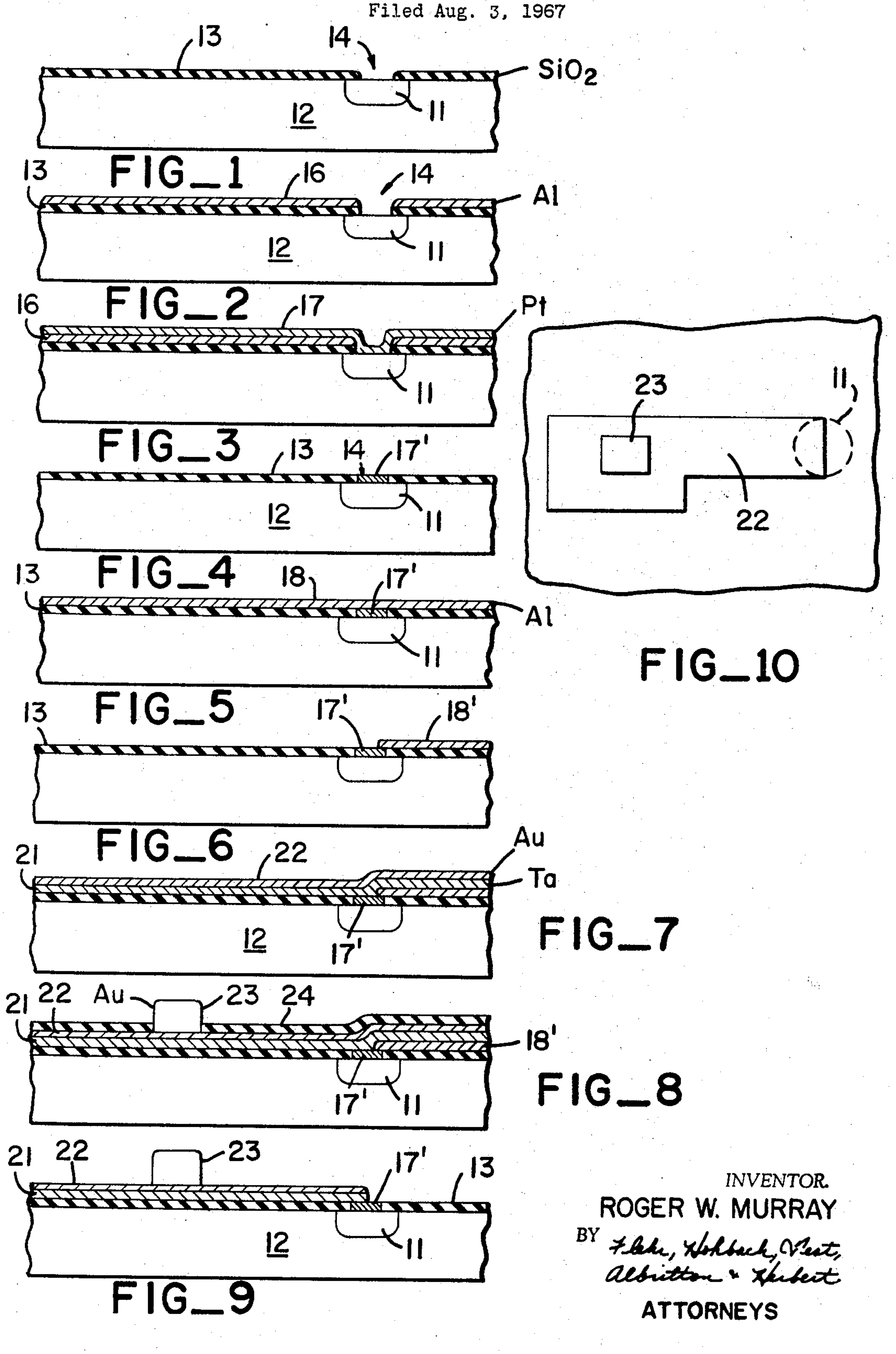
FIGURES 1 through 8 are cross-sectional views of a semiconductive chip showing the method of the present invention.
FIGURE 9 is a cross-sectional view of a completed device.
FIGURE 10 is a top view of FIGURE 9.

FIGURE 1 illustrates the basic chip type integrated circuit which in the present example includes an active semiconductive region 11 of one type conductivity which is inset into a substrate 12 of the opposite conductivity to form, for example, a diode. A silicon dioxide passivating layer 13 overlays the top surface of substrate 12 and has a window 14 formed therein by etching process to expose inset region 11. An aluminum layer 16 (FIGURE 2) is evaporated on oxide layer 13 and thereafter etched to again expose the active inset region 11. Alternatively, the aluminum layer may be constituted of silver (Ag) or copper (Cu).

A second metal layer 17 (FIGURE 3) is deposited on layer 16 and in the window region 14 to form an ohmic contact with inset region 11. This material may be either platinum (Pt) or palladium (Pd); platinum is shown.

The device of FIGURE 3 is exposed to an etching solution which selectively attacks layer 16 to allow portions of layer 17 to be stripped off except for the portion 17′ in window 14 which makes ohmic contact with region 11. More specifically, the etching solution attacks the aluminimum under layer 17 through minute pinholes which exist in the layer.

An aluminum layer 18 (FIGURE 5) is again evaporated on oxide layer 13 which now includes the platinum ohmic contact 17′. As in the case of the original aluminum layer shown in FIGURE 2, alternatively, silver or copper may be utilized. Selective masking and etching removes a portion of layer 18 leaving a portion 18′ which partially overlays ohmic contact region 17′. Layer 18′ constitutes a film of material on the integrated circuit chip which covers all areas of the chip except a certain excluded area which is to be utilized for the final electrical circuit contact between ohmic interconnection 17′ and the gold raised contact.

As illustrated in FIGURE 7, two subsequent depositions place a sublayer 21 of either tantalum (Ta) or molybdenum (Mo) over the entire integrated chip and a second overlying sublayer 22 of either gold or platinum. In the preferred embodiment tantalum and gold are used. Since layers 21 and 22 are both highly conductive, the deposition on the conductive region 17′ forms an electrical circuit path or area on the semiconductive chip.

A raised gold contact 23 is affixed by an electroplating process to layer 22 which being alternatively of either gold or platinum is compatible with the gold contact pad. At the same time, a suitable passivating surface 24 is formed on layer 22.

Finally, in the last step of forming the device of the present invention a selective etching solution is applied to the device in FIGURE 8 which etches away layer 24 and attacks the aluminum underlying film area 18' through the existing pinholes in layers 21 and 22 to allow these layers which are above the film layer 18' to be removed by stripping or peeling leaving the device shown in FIGURE 9. More specifically, layers 21 and 22 form base layer for raised contact 23 which makes an electrical contact with interconnecting region 17'. FIGURE 10 illustrates the area extent of layers 21 and 22 in forming contact between pad 23 and active semiconductor region 11.

Thus in summary, the method of the present invention allows a gold contact pad to be affixed to a compatible base of gold or platinum which materials are relatively non-etchable by known methods. But by the improved method, these difficult materials can be manipulated in the process of the present invention to form excellent electrical contact between an active region of a semiconductor chip and a raised contact pad which is necessary when using flip-chip packaging.

I claim:

1. A method of forming a flip-chip type integrated circuit which includes a raised contact pad constituted of a low resistance metal, said pad being affixed to a conductive base layer making contact with an active semiconductive region of said integrated circuit to complete an electrical circuit from said region to said pad, said electrical circuit constituting a predetermined area on said chip, said base layer being relatively difficult to etch, said method comprising the steps of, exposing an active region of said integrated circuit to which electrical contact is to be made, depositing a film of material on said chip excluding the electrical circuit area, said film being relatively easy to etch, thereafter depositing on said chip said base layer whereby a portion of said base layer overlies said film, removing said film by etching, by removing the portion of said base layer formerly overlying said film leaving said base layer deposited only on said electrical circuit area, and affixing said contact pad to said base layer.

2. A method as in claim 1 where, after said active region is exposed in the chip, a platinum ohmic interconnection is placed on it by the steps of first depositing aluminum on the chip, etching out the exposed region, depositing the platinum in the window and on the remainder of the chip, etching the underlying aluminum, and thereafter stripping away the platinum to leave such material only in the formerly exposed region.

3. A method of forming a raised contact pad as in claim 1 in which the base layer consists of a first sublayer of either tantalum or molybdenum material and a second sublayer of gold or platinum material on which the final contact pad is placed.

4. A method of forming a raised contact pad as in claim 1 in which said contact pad is of gold material.

5. A method of forming a raised contact pad as in claim 1 in which said film which is relatively easy to etch is aluminum or silver or copper.

References Cited

UNITED STATES PATENTS

| | | | |
|---|---|---|---|
| 2,728,693 | 12/1955 | Cado | 117—212 |
| 3,012,920 | 12/1961 | Christensen et al. | |
| 3,144,366 | 8/1964 | Rideout et al. | |
| 3,287,612 | 11/1966 | Lepselter | 29—578 X |
| 3,290,753 | 12/1966 | Chang | 29—577 |
| 3,365,628 | 1/1968 | Luxem et al. | 29—589 X |

CHARLIE T. MOON, *Primary Examiner.*

U.S. Cl. X.R.

117—212, 217